(12) United States Patent
Bulatowicz et al.

(10) Patent No.: US 9,726,494 B2
(45) Date of Patent: Aug. 8, 2017

(54) ATOMIC SENSOR SYSTEM

(71) Applicants: Michael D. Bulatowicz, Canoga Park, CA (US); Michael S. Larsen, Woodland Hills, CA (US)

(72) Inventors: Michael D. Bulatowicz, Canoga Park, CA (US); Michael S. Larsen, Woodland Hills, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 647 days.

(21) Appl. No.: 14/278,940

(22) Filed: May 15, 2014

(65) Prior Publication Data

US 2015/0330786 A1 Nov. 19, 2015

(51) Int. Cl.
*G01C 19/62* (2006.01)
*G01R 33/26* (2006.01)

(52) U.S. Cl.
CPC ............ *G01C 19/62* (2013.01); *G01R 33/26* (2013.01)

(58) Field of Classification Search
CPC ....................... G01C 19/62; G01R 33/26
See application file for complete search history.

(56) References Cited

U.S. PATENT DOCUMENTS

| 7,359,059 | B2 | 4/2008 | Lust et al. |
| 7,863,894 | B2 | 1/2011 | Hall |
| 7,872,473 | B2 | 1/2011 | Kitching et al. |
| 8,054,074 | B2 | 11/2011 | Ichihara et al. |
| 8,405,389 | B2 | 3/2013 | Sugioka et al. |
| 2009/0039881 | A1 | 2/2009 | Kitching et al. |
| 2011/0025323 | A1 | 2/2011 | Budker et al. |
| 2012/0113423 | A1 | 5/2012 | Groswasser |

(Continued)

FOREIGN PATENT DOCUMENTS

| EP | 1 828 717 B1 | 4/2011 |
| JP | 06-174550 | 6/1994 |

(Continued)

OTHER PUBLICATIONS

European Search Report for corresponding EP 15 16 7451 mailed Aug. 26, 2015.

(Continued)

*Primary Examiner* — Gregory H Curran
(74) *Attorney, Agent, or Firm* — Tarolli, Sundheim, Covell & Tummino LLP

(57) ABSTRACT

One embodiment includes an atomic sensor system. The system includes a vapor cell that is sealed to enclose an alkali metal that is spin-polarized by an optical beam. The vapor cell includes a mirror at a distal end. The system also includes an optical system including a photodetector system and a laser that generates the optical beam. The optical beam is provided into a proximal end of the vapor cell and is reflected back to the photodetector system via the mirror as a reflected optical beam to generate at least one intensity signal. The optical system further includes a control system that modulates a wavelength of the optical beam between an on-resonance wavelength and an off-resonance wavelength with respect to the alkali metal. The system also includes a processor that calculates a measurable parameter associated with the atomic sensor system based on the at least one intensity signal.

18 Claims, 4 Drawing Sheets

(56) References Cited

U.S. PATENT DOCUMENTS

| | | | |
|---|---|---|---|
| 2012/0182011 A1 | 7/2012 | Larsen et al. | |
| 2012/0267509 A1 | 10/2012 | Aoyama et al. | |
| 2013/0033261 A1 | 2/2013 | Walker et al. | |
| 2013/0127458 A1 | 5/2013 | Mizutani et al. | |
| 2013/0328557 A1 | 12/2013 | Larsen et al. | |
| 2014/0361768 A1* | 12/2014 | Overstreet, II | G01C 19/62 324/304 |

FOREIGN PATENT DOCUMENTS

| | | |
|---|---|---|
| JP | 2012-042237 | 3/2012 |
| JP | 2014-017824 | 1/2014 |
| WO | WO 2015/002684 A2 | 1/2015 |

OTHER PUBLICATIONS

Patton, et al.: "*A remotely interrogated all-optical Rb magnetometer*", Applied Physics Letters, American Institute of Physics, US, vol. 101, No. 8, Aug. 20, 2012 (Aug. 20, 2012), pp. 83502-83502, XP012164874, ISSN: 0003-6951, 001: 10.1063/1.4747206 [retrieved on Aug. 21, 2012] * figure 1 *.

Office Action dated May 17, 2016 for corresponding JP 215-099058; mailed Jun. 10, 2016.

* cited by examiner

ATOMIC SENSOR SYSTEM

TECHNICAL FIELD

The present invention relates generally to sensor systems, and specifically to an atomic sensor system.

BACKGROUND

Atomic sensors, such as nuclear magnetic resonance (NMR) gyroscopes and atomic magnetometers, employ optical beams to operate, such as to detect rotation about a sensitive axis or to detect the presence and magnitude of an external magnetic field. As an example, an NMR sensor system can employ a first optical beam as a pump beam and a second optical beam as a probe beam. For example, the pump beam can be a circularly-polarized optical beam that is configured to spin-polarize a vapor, such as cesium (Cs) or rubidium (Rb), within a sealed vapor cell of the sensor. The magnetic field can be generated by a magnetic solenoid to induce precession of alkali metal isotopes. The interaction between the polarized alkali metal vapor and the nuclear spin isotopes in the vapor cell gives rise to an effective magnetic field experienced by the nuclear spin isotopes based on the alkali number density and alkali fractional polarization. The greater the product of alkali number density and alkali fractional polarization, the greater the alkali magnetic field experienced by the nuclear spin isotopes.

SUMMARY

One embodiment includes an atomic sensor system. The system includes a vapor cell that is sealed to enclose an alkali metal that is spin-polarized by an optical beam. The vapor cell includes a mirror at a distal end. The system also includes an optical system including a photodetector system and a laser that generates the optical beam. The optical beam is provided into a proximal end of the vapor cell and is reflected back to the photodetector system via the mirror as a reflected optical beam to generate at least one intensity signal. The optical system further includes a control system that modulates a wavelength of the optical beam between an on-resonance wavelength and an off-resonance wavelength with respect to the alkali metal. The system also includes a processor that calculates a measurable parameter associated with the atomic sensor based on the at least one intensity signal.

Another embodiment of the invention includes a method for controlling an atomic sensor system. The method includes generating an optical beam via a laser and providing the optical beam into a proximal end of a vapor cell that is sealed to enclose an alkali metal. The vapor cell includes a mirror at a distal end to reflect the optical beam back as a reflected optical beam. The method also includes modulating a wavelength of the optical beam between an on-resonance wavelength with respect to the alkali metal to facilitate spin-polarization of the alkali metal and an off-resonance wavelength with respect to the alkali metal to provide a Faraday rotation of the reflected optical beam. The method also includes monitoring an intensity of the reflected optical beam at a plurality of photodetectors, and calculating a measurable parameter based on the intensity of the reflected optical beam. The method further includes stabilizing at least one adjustable parameter based on the intensity of the reflected optical beam to distinguish the at least one measurable parameter from a parameter change associated with the optical beam.

Another embodiment of the invention includes an atomic sensor system. The system includes a vapor cell that is sealed to enclose an alkali metal and comprising a linear polarizer and a mirror at a distal end and an optical system. The optical system includes a laser configured to generate an optical beam and a quarter-wave plate configured to circularly polarize the optical beam before it is provided into a proximal end of the vapor cell to spin-polarize the alkali metal. The optical beam can be linearly-polarized via the linear polarizer and reflected via the mirror as a reflected optical beam. The optical system also includes a plurality of polarization-analyzing photodetectors configured to generate a respective plurality of first intensity signals corresponding to a Faraday rotation of the first portion of the reflected optical beam. The optical system further includes a polarization-insensitive photodetector configured to generate a second intensity signal corresponding to the intensity of a second portion of the reflected optical beam. The atomic sensor system further includes a processor configured to calculate a measurable parameter associated with the atomic sensor system based on the plurality of first intensity signals and to stabilize at least one adjustable parameter associated with the atomic sensor system based on the second intensity signal.

DETAILED DESCRIPTION

Figure 1:
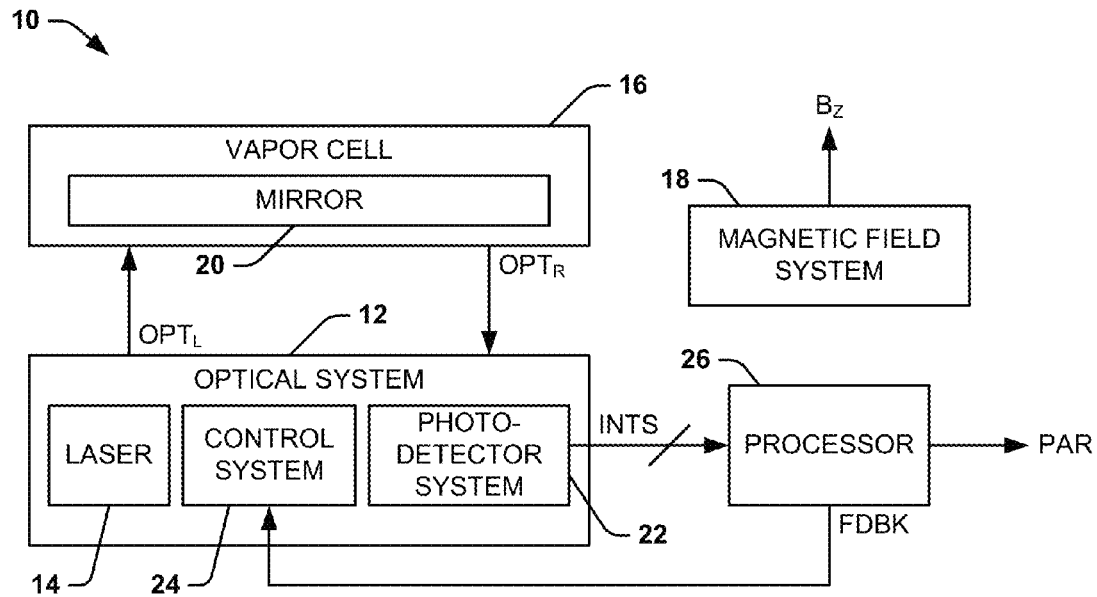
FIG. 1 illustrates an example of an atomic sensor system.

The present invention relates generally to sensor systems, and specifically to an atomic sensor system. The atomic sensor system can correspond to, for example, a nuclear magnetic resonance (NMR) gyroscope or an atomic magnetometer. The atomic sensor system includes a vapor cell having an alkali metal, and can also include at least one gyromagnetic (e.g., noble gas) isotope. As an example, a magnetic field source can generate a substantially uniform magnetic field that is provided through the vapor cell and which is aligned with a sensitive axis of the atomic sensor system. The system also includes an optical system that includes a laser (e.g., a vertical-cavity surface-emitting laser (VCSEL)) to generate an optical beam. The vapor cell can also include a linear polarizer and a mirror at a distal end of the vapor cell to linearly polarize the optical beam and to reflect the optical beam back as a reflected optical beam.

The optical system can also include a quarter-wave plate to circularly polarize the optical beam and to provide the circularly-polarized optical beam into a proximal end of the vapor cell. Thus, the circularly-polarized optical beam acts as an optical pump beam to spin-polarize the alkali metal, thus facilitating precession of the alkali metal and the gyromagnetic isotope in response to the magnetic field. As an example, the system can also include a second magnetic field source to generate a magnetic field orthogonal to the first magnetic field, thus providing a net magnetic field that is misaligned with the sensitive axis to induce the alkali metal and the gyromagnetic isotope to precess. Additionally, the linearly-polarized reflected optical beam is provided on photodetectors that generate respective intensity signals. A processor can be configured to calculate a measurable parameter based on the intensity signals. For example, the intensity signals can correspond to an amount of Faraday rotation of the reflected optical beam, and can thus be indicative of the measurable parameter of the atomic sensor system (e.g., rotation about a sensitive axis and/or a magnitude of an external magnetic field).

For example, the optical system can include a control system that is configured to modulate the optical beam between an on-resonance wavelength and an off-resonance wavelength with respect to the alkali metal. As an example, the off-resonance wavelength can be provided as two different off-resonance wavelengths that are approximately equal and opposite with respect to the on-resonance wavelength. Therefore, during the time duration of the on-resonance wavelength, the optical beam can pump the alkali metal for the spin-polarization to facilitate precession. During the time duration of the off-resonance wavelength, the linearly-polarized reflected optical beam can experience Faraday rotation, and can thus be indicative of the measurable parameter. Additionally, the optical system can include a polarization-insensitive photodetector that is configured to monitor an intensity of the reflected optical beam during both the first duration and the second duration. Therefore, an intensity signal provided by the polarization-insensitive photodetector can be implemented by the processor to control at least one adjustable parameter (e.g., temperature of the vapor cell or frequency of the optical beam), such that a change in a parameter associated with the optical beam (e.g., intensity or frequency) can be distinguished from a change in the measurable parameter.

FIG. 1 illustrates an example of an atomic sensor system 10. The atomic sensor system 10 can correspond to any of a variety of NMR sensors, such as an NMR gyroscope that is configured to measure rotation about a sensitive axis or an atomic magnetometer that is configured to measure a magnitude of an externally provided magnetic field. The atomic sensor system 10 can thus be provided in any of a variety of applications, such as navigation and/or defense applications.

The atomic sensor system 10 includes an optical system 12. The optical system 12 includes a laser 14, such as a vertical-cavity surface-emitting laser (VCSEL), that is configured to generate an optical beam $OPT_L$ that is provided into a vapor cell 16. As an example, the optical system 12 can include a quarter-wave plate that is configured to circularly polarize the optical beam $OPT_L$. As an example, the optical beam $OPT_L$ can be provided approximately parallel (e.g., collinearly) with a sensitive axis of the atomic sensor system 10. The atomic sensor system 10 further includes a magnetic field generator 18 configured to generate a bias magnetic field $B_Z$ that is provided through the vapor cell 16 in a direction that is substantially parallel with the optical beam $OPT_L$. The bias magnetic field $B_Z$ can be configured to stimulate precession of the alkali metal vapor in the vapor cell 16 in a resonant condition to substantially amplify the modulation of the polarization vector of the alkali metal vapor in the vapor cell 16 in response to magnetic fields applied orthogonally with respect to the optical beam $OPT_L$ (e.g., external orthogonal magnetic field components).

In the example of FIG. 1, the vapor cell 16 includes a mirror 20 that can be located at a distal end of the vapor cell 16 with respect to the optical beam $OPT_L$. Thus, the mirror 20 can be configured to reflect the optical beam $OPT_L$ back as a reflected optical beam $OPT_R$. For example, the vapor cell 16 can also include a linear polarizer arranged in front of the mirror 20 (e.g., between the proximal end of the vapor cell 16 and the mirror 20). Thus, the reflected optical beam $OPT_R$ can be linearly polarized. The optical system 12 includes a photodetector system 22 that is configured to receive the reflected optical beam $OPT_R$ and to determine an intensity of the reflected optical beam $OPT_R$. As an example, the photodetector system 22 can include a plurality of polarization-analyzing photodetectors (e.g., photodiodes) that are each configured to generate intensity signals, demonstrated collectively in the example of FIG. 1 as a signal INTS. The polarization-analyzing photodetectors can be configured as photodetectors having a linear polarizer in the optical path of the reflected optical beam $OPT_R$. Thus, the intensity signals INTS can correspond to a Faraday rotation of the reflected optical beam $OPT_R$ through the vapor cell 16.

In addition, the optical system 12 includes a control system 24. The control system 24 can be configured to control parameters associated with the laser 14 and/or the vapor cell 16. As one example, the control system 24 can be configured to stabilize a temperature of the vapor cell 16, as described in greater detail herein. As another example, the control system 24 can be configured to stabilize a frequency and an intensity of the laser 14, as also described in greater detail herein. Furthermore, the control system 24 can be configured to modulate the frequency of the laser 14. As an example, the control system 24 can modulate the optical beam $OPT_L$ between a first wavelength that is substantially on-resonance with respect to the alkali metal in the vapor cell 16 and a second wavelength that is substantially off-resonance with respect to the alkali metal in the vapor cell 16.

For example, the control system 24 can set the wavelength of the optical beam $OPT_L$ to the on-resonance wavelength during a first time duration of a period of the modulation, to a first off-resonance wavelength during a second time duration of the period of the modulation, and to a second off-resonance wavelength during a third time duration of the period of the modulation. As an example, the first and second off-resonance wavelengths can be approximately equal and opposite with respect to the on-resonance wavelength. The on-resonance wavelength can enable the optical beam $OPT_L$ to optically pump the alkali metal to provide the spin-polarization, and the off-resonance wavelength can allow for the Faraday rotation of the reflected optical beam $OPT_R$ for the detection of a measurable parameter associated with the atomic sensor system 10. As described herein, the term "measurable parameter" describes a parameter for which the atomic sensor system 10 is designed to measure, such as rotation about a sensitive axis in the example of an NMR gyroscope or a magnitude of an external magnetic field in the example of an atomic magnetometer.

As an example, the vapor cell 16 can be configured as a sealed cell having a transparent or translucent casing that includes an alkali metal vapor (e.g., cesium (Cs) or rubidium (Rb)) and can include a gyromagnetic isotope (e.g., noble gas isotope, such as argon (Ar) or xenon (Xe)). The on-resonance wavelength of the optical beam $OPT_L$ can correspond to an emission line of the alkali metal vapor in the vapor cell 18 (e.g., D1 or D2). The vapor cell 16 can thus comprise the operative physics portion of the atomic sensor system 10. During the first time duration, when the optical beam $OPT_L$ has the substantially on-resonance wavelength as set by the control system 24, the optical beam $OPT_L$ acts as an optical pump beam to spin-polarize the alkali metal vapor therein. As an example, noble gas isotopes within the vapor cell 16 can precess in the presence of the magnetic field $B_Z$, such that the spin-polarized alkali metal vapor particles can have their spin-polarization modulated to result in a component of the net spin-polarization being aligned with the precessing noble gas isotopes. During the second and third time durations, when the optical beam $OPT_L$ has the substantially off-resonance wavelengths as set by the control system 24, the optical beam $OPT_L$ acts as an optical probe beam to measure the precession of the noble gas isotopes via the reflected optical beam $OPT_R$. As an example, the Faraday rotation of the linearly-polarized reflected optical beam $OPT_R$ exiting the vapor cell 16 can be determined based on the component of the spin-polarization of the alkali metal vapor in the vapor cell 16 oriented along the direction of propagation of the reflected optical beam $OPT_R$. Accordingly, based on the modulation of the optical beam $OPT_L$, the optical beam $OPT_L$ can provide the function of both an optical pump beam and an optical probe beam with a single laser (e.g., the laser 14).

The atomic sensor system 10 includes a processor 26 that is configured to calculate the measurable parameter based on the intensity signals INTS. In the example of FIG. 1, the processor 26 is configured to generate a signal PAR corresponding to the measurable parameter. As described previously, the intensity signals INTS can correspond to a Faraday rotation of the reflected optical beam $OPT_R$ through the vapor cell 16. For example, a difference between the intensity signals INTS during the second time duration of the period of the modulation of the optical signal $OPT_L$, can be indicative of the alkali metal spin-polarization vector X-Y plane components (e.g., relative to a Z-axis corresponding to the sensitive axis of the atomic sensor system) while a sum of the intensity signals INTS during the second time period can be indicative of the alkali metal spin-polarization vector Z-axis component. Similarly, a difference between the intensity signals INTS during the third time duration of the period of the modulation of the optical signal $OPT_L$, can be indicative of the alkali metal spin-polarization vector X-Y plane components (e.g., relative to the Z-axis), while a sum of the intensity signals INTS during the third time period can be indicative of the alkali metal spin-polarization vector Z-axis component. Additionally, a sum of the difference of intensity signals INTS measured during the second time period and the difference of intensity signals INTS measured during the third time period can substantially cancel common-mode error sources based on approximately equal and opposite Faraday rotations during the second and third time periods as a result of substantially equal and opposite off-resonance wavelength detuning, thus improving the accuracy and stability of the measurement of the X-Y plane components of the alkali spin-polarization vector. Correspondingly, a sum comprising a sum of the intensity signals INTS measured during the second time period and a sum of intensity signals INTS measured during the third time period can substantially cancel common-mode error sources in the measurement of the Z-axis component of the alkali spin vector. Therefore, a spin-precession of an associated gyromagnetic isotope about the sensitive axis corresponding to measurable parameter can be measured. Accordingly, a rotation of the atomic sensor system 10, a magnitude of an external magnetic field, or a spin precession frequency or phase can be measured in response to determining the precession of the gyromagnetic isotopes based on implementing the single laser 14, as described herein.

In addition, the processor 26 can be configured to stabilize parameters associated with the atomic sensor system 10 based on the intensity signals INTS. As an example, the photodetector system 22 can include one or more polarization-insensitive photodetectors. For example, the polarization-insensitive photodetector can be configured as a photodetector that does not include a linear polarizer in the optical path of the reflected optical beam $OPT_R$. Therefore, during the off-resonance wavelength modulation of the optical beam $OPT_L$, the polarization-insensitive photodetector can be configured to measure changes in absorption of the optical beam $OPT_L$ by the alkali metal as a function of wavelength. Therefore, the processor 26 can be configured to provide a feedback signal FDBK to the control system 26 to stabilize the frequency of the optical signal $OPT_L$ (e.g., the on-resonance wavelength). For example, the processor 26 can monitor the intensity signal INTS that corresponds to the polarization-insensitive photodetector during the second and third time durations, and thus during the approximately equal and opposite substantially off-resonance wavelengths of the optical beam $OPT_L$, to substantially stabilize the on-resonance wavelength of the optical beam $OPT_L$ based on the symmetry of the approximately equal and opposite substantially off-resonance wavelengths of the optical beam $OPT_L$ about the substantially on-resonance wavelength.

Additionally, the processor 26 can stabilize other adjustable parameters based on the intensity signal INTS provided via the polarization-insensitive photodetector of the photodetector system 22. As an example, during the first time duration of the period of the modulation of the optical beam $OPT_L$, and thus during the substantially on-resonance wavelength of the optical beam $OPT_L$, the processor 26 can implement the intensity signal INTS to stabilize the temperature of the vapor cell 16. For example, the first time duration can be greater than both the second and third time durations combined, such that the intensity of the optical beam $OPT_L$ during the first time duration is monitored for a larger portion of each period of the modulation and is not subject to rapid change (e.g., and does not change in ideal conditions). Therefore, gradual changes in the intensity signal INTS provided via the polarization-insensitive photodetector, such as based on changes in absorption of the optical beam $OPT_L$, can be indicative of changes in temperature of the vapor cell 16, such that the feedback signal FDBK can also provide temperature adjustments to the vapor cell 16 (e.g., via an associated heating system (not shown)). As another example, the processor 26 can adjust an intensity of the optical signal $OPT_L$, such as based on a lasing current with respect to the laser 14, to stabilize the atomic sensor system 10 in response to the gradual changes in the intensity signal INTS provided via the polarization-insensitive photodetector, such as based on changes in absorption of the optical beam $OPT_L$. As yet another example, the processor 26 can adjust the intensity of the optical signal $OPT_L$ or the temperature of the vapor cell 16 to stabilize the atomic sensor system 10 based on a sum of the intensity signal INTS provided via the polarization-insensitive photodetector during the second and third time durations, as opposed to the first time duration.

As a result of the stabilization of the parameters of the atomic sensor system 10, such as stabilizing frequency of the optical beam $OPT_L$, temperature of the vapor cell 16, and/or the intensity of the laser 14, the processor 26 can calculate the measurable parameter PAR more accurately. For example, because the photodetector system 22 includes the polarization-insensitive photodetector, the processor 26 can distinguish intensity changes of the reflected optical beam $OPT_R$, as provided by the signals INTS, that result from changes in the measurable parameter from parameter changes associated with the optical beam $OPT_L$ (e.g., absorption of the optical beam $OPT_L$, frequency drift, etc.) that can occur based on changes in environment. Therefore, the processor 26 can calculate the measurable parameter PAR independently of changes in environment based on implementation of the single laser 14.

Figure 2:
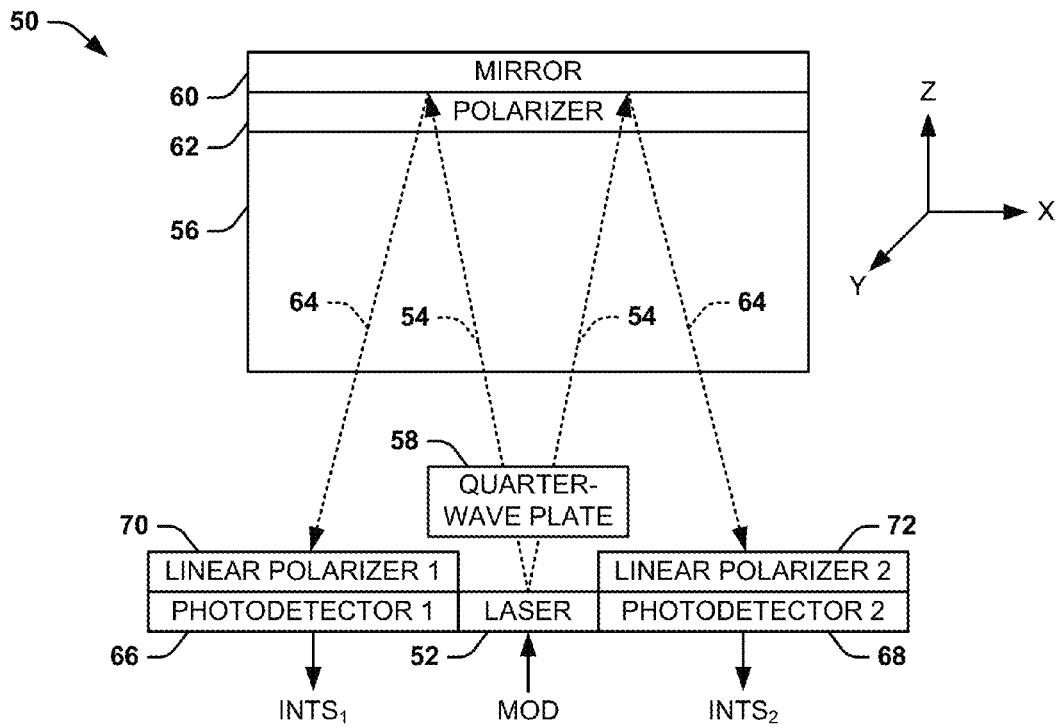
FIG. 2 illustrates another example of an atomic sensor system.

FIG. 2 illustrates another example of an atomic sensor system 50. The atomic sensor system 50 can correspond to a portion of the atomic sensor system 10 in the example of FIG. 1. Therefore, reference is to be made to the example of FIG. 1 in the following description of the example of FIG. 2.

The atomic sensor system 50 includes a laser 52, such as a VCSEL, that is configured to generate an optical beam 54 (e.g., the optical beam $OPT_L$) that is divergent from an aperture of the laser 52. As an example, the optical beam 54 can be provided approximately parallel (e.g., collinearly) with a sensitive axis, demonstrated in the example of FIG. 2 as the Z-axis, of the atomic sensor system 50. The optical beam 54 is provided into a proximal side of a vapor cell 56. A quarter-wave plate 58 is arranged in an optical path of the optical beam 54 and is configured to circularly polarize the optical beam 54 prior to entry into the vapor cell 56. The vapor cell 56 includes a mirror 60 and a linear polarizer 62 that are located at a distal end of the vapor cell 56 with respect to the optical beam 54. The linear polarizer 62 is arranged in front of the mirror 60, and can thus linearly-polarize the optical beam 54 before the optical beam 54 is reflected back via the mirror 60 as a reflected optical beam 64. Because the optical beam 54 diverges from the aperture of the laser 52, the reflected optical beam 64 diverges further with respect to the Z-axis.

The atomic sensor system 50 includes a first photodetector 66 and a second photodetector 68 that are arranged on opposing sides of the laser 52. The atomic sensor system 50 also includes a first linear polarizer 70 and a second linear polarizer 72 that are arranged in an optical path of reflected optical beam 64 with respect to each of the first and second photodetectors 66 and 68, respectively. Thus, the first photodetector 66 and the first linear polarizer 70 are collectively arranged as a first polarization-analyzing photodetector, and the second photodetector 68 and the second linear polarizer 72 are collectively arranged as a second polarization-analyzing photodetector. For example, the first photodetector 66 is configured to generate a first intensity signal $INTS_1$ and the second photodetector 68 is configured to generate a second intensity signal $INTS_2$ that each correspond to an intensity of a vector component of alkali spin-polarization in the respective propagation directions of respective components of the reflected optical beam 64. Accordingly, the first and second intensity signals $INTS_1$ and $INTS_2$ can correspond to a Faraday rotation of the reflected optical beam 64 through the vapor cell 56. The difference of the intensity signals $INTS_1$ and $INTS_2$, therefore, corresponds to the X-Y plane component of alkali spin-polarization, while the sum of the intensity signals $INTS_1$ and $INTS_2$ corresponds to the Z-axis component of alkali spin-polarization. The laser 52, the photodetectors 66 and 68, the linear polarizers 70 and 72, and the quarter-wave plate 58 can collectively correspond to the optical system 12 in the example of FIG. 1.

In the example of FIG. 2, the laser 52 receives a signal MOD that can correspond to a modulated current that is implemented to generate the optical beam 54. As an example, the signal MOD can modulate the frequency of the optical beam 54 generated by the laser 52, such as between a first wavelength that is substantially on-resonance with respect to the alkali metal in the vapor cell 56 and a second wavelength that is substantially off-resonance with respect to the alkali metal in the vapor cell 56.

Figure 3:
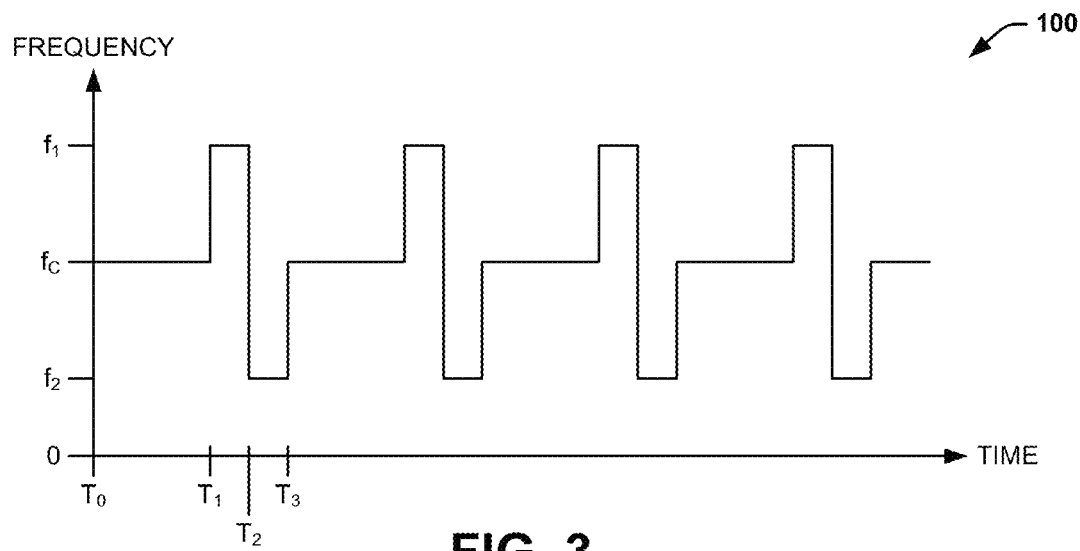
FIG. 3 illustrates an example of a timing diagram.

FIG. 3 illustrates an example of a timing diagram 100. The timing diagram 100 demonstrates a frequency of the optical beam 54 as a function of time. At a time $T_0$, the frequency of the optical beam 54 is demonstrated as having a frequency $f_C$, which can correspond to a center frequency that is associated with an on-resonance wavelength with respect to the alkali metal in the vapor cell 56 (e.g., corresponding to an emission line of the alkali metal vapor in the vapor cell 56 (e.g., D1 or D2)). Therefore, while the frequency of the optical beam 54 is set to the frequency $f_C$, the optical beam 54 acts as an optical pump beam to optically pump the alkali metal in the vapor cell 56, thus spin-polarizing the alkali metal in the vapor cell 56. At a time $T_1$, the frequency of the optical beam 54 increases to a frequency $f_1$. Therefore, the duration of time between the time $T_0$ and the time $T_1$ corresponds to the first duration of time of the period of the modulation of the optical beam 54.

The frequency $f_1$ can correspond to a substantially off-resonance wavelength of the optical beam 54. Therefore, while the frequency of the optical beam 54 is set to the frequency $f_1$, the optical beam 54 acts as an optical probe beam to facilitate Faraday rotation of the linearly-polarized reflected optical beam 64 as it passes through the vapor cell 56 after having been reflected by the mirror 60. At a time $T_2$, the frequency of the optical beam 54 decreases to a frequency $f_2$. Therefore, the duration of time between the time $T_1$ and the time $T_2$ corresponds to the second duration of time of the period of the modulation of the optical beam 54. In the example of FIG. 3, the frequency $f_2$ can be approximately equal and opposite the frequency $f_1$ with respect to the center frequency $f_C$. The frequency $f_2$ can likewise correspond to a substantially off-resonance wavelength of the optical beam 54. Therefore, while the frequency of the optical beam 54 is set to the frequency $f_2$, the optical beam 54 acts as an optical probe beam to facilitate Faraday rotation of the linearly-polarized reflected optical beam 64 as it passes through the vapor cell 56 after having been reflected by the mirror 60.

At a time $T_3$, the frequency of the optical beam 54 increases once again to the center frequency $f_C$. Therefore, the duration of time between the time $T_2$ and the time $T_3$ corresponds to the third duration of time of the period of the modulation of the optical beam 54. Accordingly, the time duration between the time $T_0$ and the time $T_3$ can correspond to an entire period of the modulation of the optical beam 54 via the modulation signal MOD. As an example, the time duration between the times $T_1$ and $T_2$ and between the times $T_2$ and $T_3$ can be approximately equal. In the example of FIG. 3, the time duration between the time $T_0$ and the time $T_1$ is demonstrated as greater than the time duration between the times $T_1$ and $T_2$ and between the times $T_2$ and $T_3$ (e.g., greater than a sum of the second and third time durations). Therefore, a greater portion of the period of the modulation of the optical beam 54 can be devoted to providing the optical beam 54 as having the functionality of an optical pump beam to spin-polarize the alkali metal and for stabilization of absorption of the optical beam 54 by the alkali metal.

It is to be understood that the timing diagram 100 is not intended to be limited to the example of FIG. 2. For example, while the second time duration (i.e., the time duration between the times $T_1$ and $T_2$) and the third time duration (i.e., between the times $T_2$ and $T_3$) are demonstrated as approximately equal, the second and third time durations could have unequal time durations, and could include only a single frequency that is associated with an off-resonance wavelength with respect to the alkali metal (e.g., the frequency $f_1$). Additionally, the frequencies $f_1$ and $f_2$ are not limited to being approximately equal and opposite, but could have separate frequency differences with respect to the frequency $f_C$, and could also both be greater than or less than the frequency $f_C$. Such flexibility and a priori knowledge of the frequencies associated with the off-resonance wavelengths could allow for different calculations of the measurable parameter PAR and/or different stabilization techniques, as described herein. Therefore, the modulation of the optical beam $OPT_L$ can be provided in a variety of different ways.

Referring back to the example of FIG. 2, during the first time duration (e.g., between the times $T_0$ and $T_1$), when the optical beam 54 has the substantially on-resonance wavelength as set by the control system 24, the optical beam 54 acts as an optical pump beam to spin-polarize the alkali metal vapor in the vapor cell 56. As an example, noble gas isotopes within the vapor cell 56 can precess in the presence of the magnetic field $B_Z$, such that the spin-polarized alkali metal vapor particles can have their spin-polarization modulated to result in a component of the net spin-polarization being aligned with the precessing noble gas isotopes. During the second and third time durations (e.g., between the times $T_1$ and $T_3$), when the optical beam 54 has the substantially off-resonance wavelengths as set by the control system 24, the optical beam 54 acts as an optical probe beam to measure the precession of the noble gas isotopes via the reflected optical beam 64. As an example, the difference component of the intensity signals $INTS_1$ and $INTS_2$ can be used to measure the component of Faraday rotation of the linearly-polarized reflected optical beam 64 exiting the vapor cell 56 based on a projection of the spin-polarization of the alkali metal vapor in the vapor cell 56 along the axis orthogonal to the optical beam 54 (i.e. the X-Y plane component of the alkali spin-polarization vector). Accordingly, based on the modulation of the optical beam 54, the optical beam 54 can provide the function of both an optical pump beam and an optical probe beam with the single laser 52.

As described previously, the intensity signals $INTS_1$ and $INTS_2$ generated by the first photodetector 66 and the second photodetector 68, respectively, can correspond to a Faraday rotation of the reflected optical beam 64 through the vapor cell 56. For example, a difference between the intensity signals $INTS_1$ and $INTS_2$ during the second time duration (e.g., between the times $T_1$ and $T_2$) and a difference between the intensity signals $INTS_1$ and $INTS_2$ during the third time duration (e.g., between the times $T_2$ and $T_3$) of the period of the modulation of the optical signal 54, can be indicative of the alkali metal spin-polarization vector X-Y plane components (e.g., relative to the sensitive axis along the Z-axis). Therefore, a spin precession of an associated gyromagnetic isotope about the sensitive axis corresponding to the measurable parameter PAR can be measured. Accordingly, a rotation of the atomic sensor system 10, a magnitude of an external magnetic field, or a spin precession frequency or phase can be measured in response to determining the precession of the gyromagnetic isotopes based on implementing the single laser 14, as described herein.

As described previously, the optical beam 54 is provided as a diverging beam from the laser 52, and the reflected optical beam 64 is thus further divergent upon being reflected by the mirror 60. Thus, the divergence of the reflected optical beam 64 thus allows the arrangement of the quarter-wave plate 58 to not be in the optical path of the reflected optical beam 64. As an example, the photodetectors 66 and 68 can be arranged to substantially surround the laser 52 to allow the reflected optical beam 64 to be incident on the linear polarizers 70 and 72. Additionally, similar to as described previously, the atomic sensor system 50 can include a polarization-insensitive photodetector that can be implemented to stabilize at least one adjustable parameter to distinguish the measurable parameter from a parameter change associated with the optical beam 54.

Figure 4:
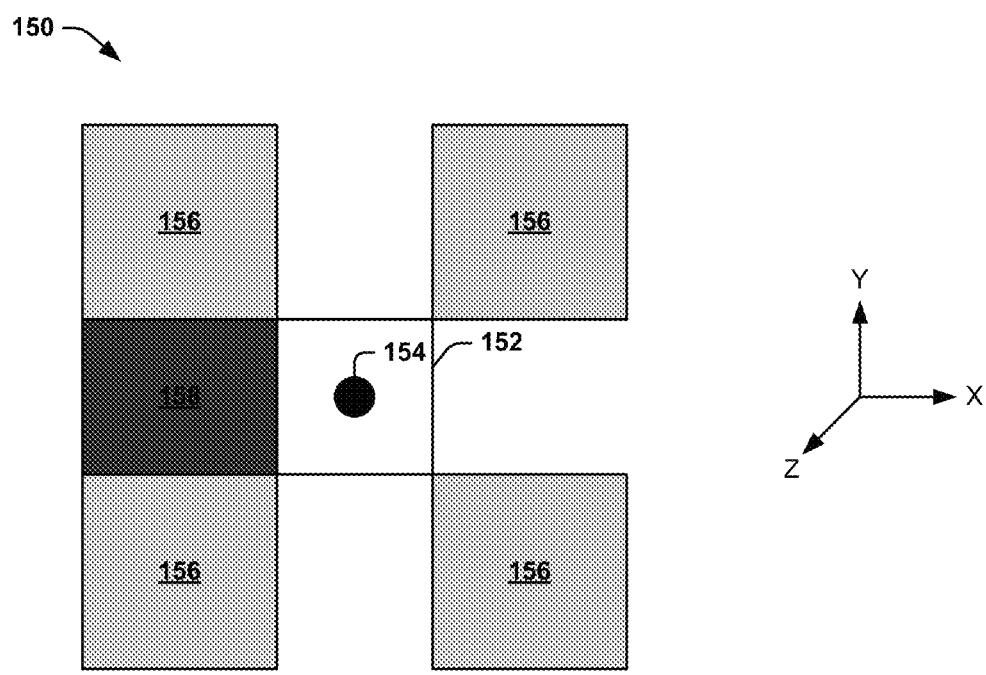
FIG. 4 illustrates an example of an optical system.

FIG. 4 illustrates an example of an optical system 150. The optical system 150 can correspond to the optical system 12 in the example of FIG. 1, and can correspond to a portion of the optical system formed by the laser 52 and the photodetectors 66 and 68 from an overhead view (e.g., the −Z-axis). The optical system 150 includes a VCSEL 152 that can correspond to the laser 52 and which includes an aperture 154 that can be designed to provide the optical beam 54 as a divergent beam. The optical system 150 also includes a plurality of polarization-analyzing photodetectors 156. As an example, the polarization-analyzing photodetectors 156 can correspond to photodetectors having an overlying linear polarizer, such that the linear polarizer is in the optical path of the reflected optical beam 64. Furthermore, the optical system 150 includes a polarization-insensitive photodetector 158, which can be configured as a photodetector without an overlying linear polarizer. Each of the polarization-analyzing photodetectors 156 and the polarization-insensitive photodetector 158 can be configured to generate intensity signals (e.g., the intensity signals INTS in the example of FIG. 1).

In the example of FIG. 4, each of the polarization-analyzing photodetectors 156 and the polarization-insensitive photodetector 158 are arranged as substantially surrounding the VCSEL 152, such that each of the polarization-analyzing photodetectors 156 and the polarization-insensitive photodetector 158 are in the optical path of the divergent reflected optical beam 64. As described previously, the polarization-analyzing photodetectors 156 are configured to generate respective intensity signals that can correspond to the Faraday rotation of respective portions of the reflected optical beam 64 (e.g., during the time duration between the times $T_1$ and $T_3$). As also described previously, the polarization-insensitive photodetector 158 can be configured to generate an intensity signal that can be implemented to stabilize the at least one adjustable parameter to distinguish the measurable parameter from a parameter change associated with the optical beam 54. Therefore, as described herein, the processor 26 can be configured to calculate the measurable parameter PAR in an accurate manner that is distinguished from environment-based changes to the parameters of the atomic sensor system 50. While the example of FIG. 4 demonstrates four polarization-analyzing photodetectors 156 and a single polarization-insensitive photodetector 158, it is to be understood that other arrangements of photodetectors 156 and 158 are possible to receive the incident reflected optical beam 64.

Figure 5:
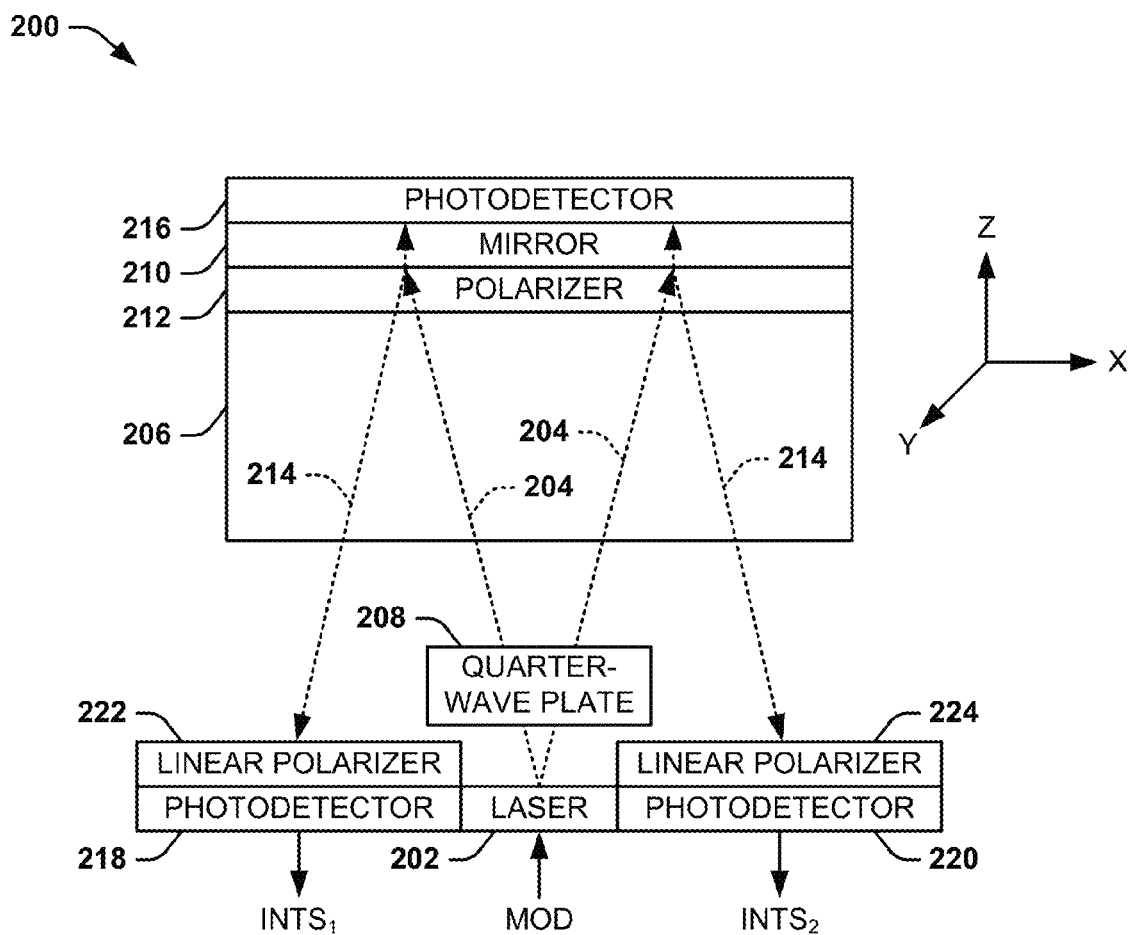
FIG. 5 illustrates yet another example of an atomic sensor system.

FIG. 5 illustrates yet another example of an atomic sensor system 200. The atomic sensor system 200 can be configured substantially similar to the atomic sensor system 50 in the example of FIGS. 2 and 4. The atomic sensor system 200 includes a laser 202, such as a VCSEL, that is configured to generate an optical beam 204 (e.g., the optical beam $OPT_L$) that is divergent from an aperture of the laser 202. As an example, the optical beam 204 can be provided approximately parallel (e.g., collinearly) with a sensitive axis, demonstrated in the example of FIG. 2 as the Z-axis, of the atomic sensor system 200. The optical beam 204 is provided into a proximal side of a vapor cell 206. A quarter-wave plate 208 is arranged in an optical path of the optical beam 204 and is configured to circularly polarize the optical beam 204 prior to entry into the vapor cell 206. The vapor cell 206 includes a mirror 210 and a linear polarizer 212 that are located at a distal end of the vapor cell 206 with respect to the optical beam 204. The linear polarizer 212 is arranged in front of the mirror 210, and can thus linearly-polarize the optical beam 204 before the optical beam 204 is reflected back via the mirror 210 as a reflected optical beam 214. Because the optical beam 204 diverges from the aperture of the laser 202, the reflected optical beam 214 diverges further with respect to the Z-axis.

In the example of FIG. 5, the vapor cell 256 further includes a photodetector 216 that is arranged on a distal side of the mirror 210. For example, the mirror 210 can be configured as a partially silvered mirror, such that a first portion of the optical beam 204 is reflected from the mirror 210 as the reflected optical beam 214. However, a second portion of the optical beam 204 is transmitted through the partially silvered mirror 210 and is provided to the photodetector 216. Thus, the photodetector 216 can be configured to monitor an intensity of the optical beam 204 at all times, such that the photodetector 216 can be configured as a polarization-insensitive photodetector. Therefore, the photodetector 216 can be implemented instead of the polarization-insensitive photodetector that can receive the reflected optical beam 64 in the example of FIG. 2 (e.g., the polarization-insensitive photodetector 158 in the example of FIG. 4).

The atomic sensor system 200 also includes a first photodetector 218 and a second photodetector 220 that are arranged on opposing sides of the laser 202. The atomic sensor system 200 also includes a first linear polarizer 222 and a second linear polarizer 224 that are arranged in an optical path of reflected optical beam 214 with respect to each of the first and second photodetectors 218 and 220, respectively. Thus, the first photodetector 218 and the first linear polarizer 222 are collectively arranged as a first polarization-analyzing photodetector, and the second photodetector 220 and the second linear polarizer 224 are collectively arranged as a second polarization-analyzing photodetector. For example, the first photodetector 218 is configured to generate a first intensity signal $INTS_1$ and the second photodetector 220 is configured to generate a second intensity signal $INTS_2$ that each correspond to an intensity of a vector component of alkali spin-polarization in the direction of propagation of respective portions of the reflected optical beam 214. Accordingly, the first and second intensity signals $INTS_1$ and $INTS_2$ can correspond to a Faraday rotation of the reflected optical beam 64 through the vapor cell 206. The laser 202, the photodetectors 218 and 220, the quarter-wave plate 208, and the photodetector 216 can collectively correspond to the optical system 12 in the example of FIG. 1. Accordingly, similar to as described previously, the processor 26 can be configured to calculate the measurable parameter PAR based on the single laser 202 in response to modulation of the optical beam 204, such as based on the modulation demonstrated in the diagram 100 in the example of FIG. 3.

Figure 6:
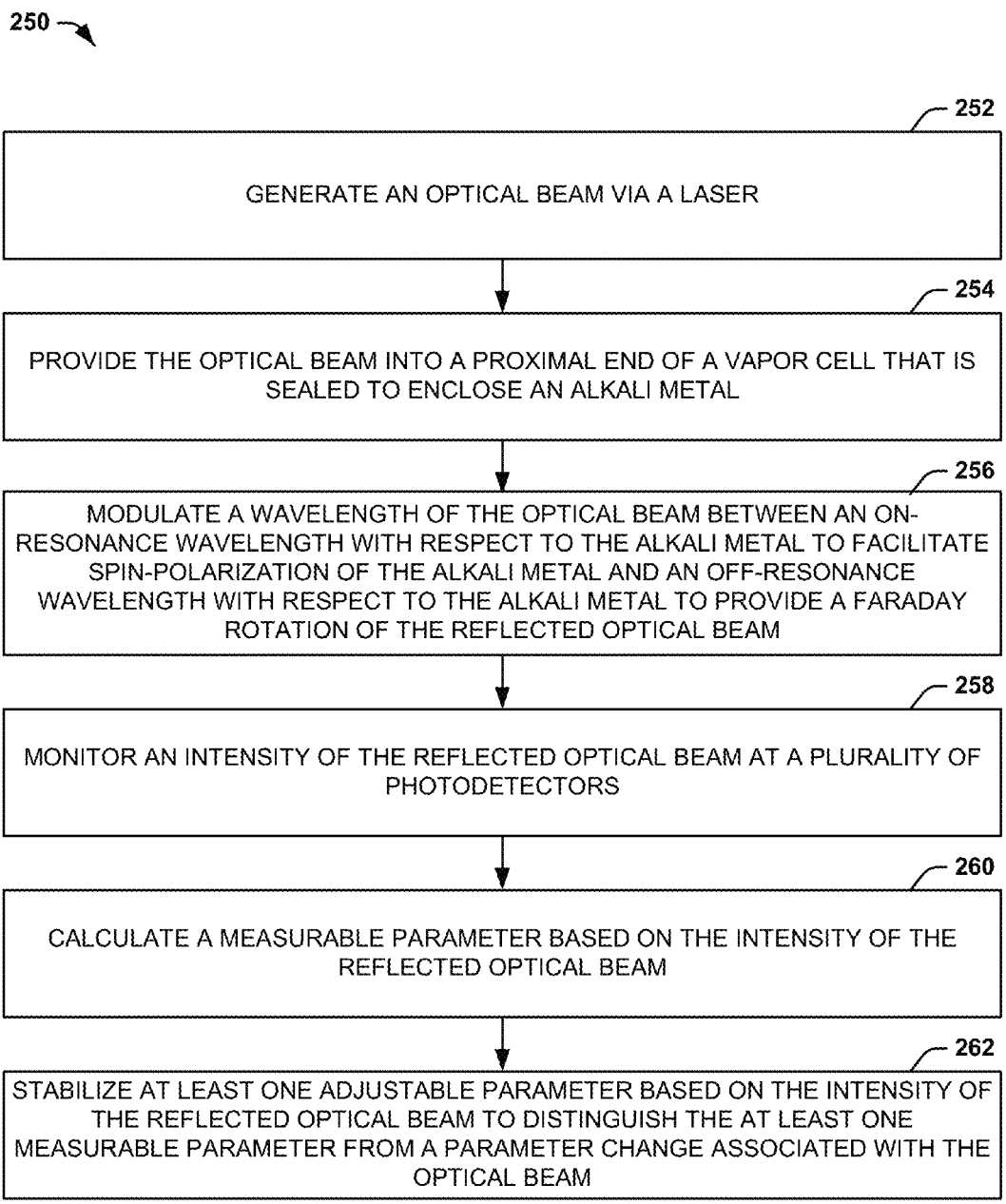
FIG. 6 illustrates an example of a method for controlling an atomic sensor system.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 250 for controlling an atomic sensor system (e.g., the atomic sensor system 10). At 252, an optical beam (e.g., the optical beam $OPT_L$) is generated via a laser (e.g., the laser 12). At 254, the optical beam is provided into a proximal end of a vapor cell (e.g., the vapor cell 16) that is sealed to enclose an alkali metal. The vapor cell includes a mirror (e.g., the mirror 20) at a distal end to reflect the optical beam back as a reflected optical beam (e.g., the reflected optical beam $OPT_R$). At 256, a wavelength of the optical beam is modulated between an on-resonance wavelength (e.g., the frequency $f_C$) with respect to the alkali metal to facilitate spin-polarization of the alkali metal and an off-resonance wavelength (e.g., the frequencies $f_1$ and $f_2$) with respect to the alkali metal to provide a Faraday rotation of the reflected optical beam. At 258, an intensity of the reflected optical beam is monitored at a plurality of photodetectors (e.g., the photodetector system 22). At 260, a measurable parameter (e.g., the measurable parameter PAR) is calculated based on the intensity of the reflected optical beam. At 262, at least one adjustable parameter is stabilized based on the intensity of the reflected optical beam to distinguish the at least one measurable parameter from a parameter change associated with the optical beam.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An atomic sensor system comprising:
    a vapor cell that is sealed to enclose an alkali metal that is spin-polarized by an optical beam, the vapor cell comprising a mirror at a distal end;
    an optical system comprising a laser configured to generate the optical beam and a photodetector system, the optical beam being provided into a proximal end of the vapor cell and is reflected back to the photodetector system via the mirror as a reflected optical beam to generate at least one intensity signal, the optical system further comprising a control system configured to modulate a wavelength of the optical beam between an on-resonance wavelength and an off-resonance wavelength with respect to the alkali metal; and
    a processor configured to calculate a measurable parameter associated with the atomic sensor system based on the at least one intensity signal and to stabilize at least one of a temperature of the vapor cell in response to the at least one intensity signal based on the on-resonance wavelength of the optical beam and a frequency of the optical beam in response to the at least one intensity signal based on the off-resonance wavelength of the optical beam.

2. The system of claim 1, wherein the optical system comprises a quarter-wave plate configured to circularly polarize the optical beam before it is provided into the proximal end of the vapor cell, wherein the vapor cell comprises a first linear polarizer configured to convert the optical beam to a linear polarization, and wherein the photodetector system comprises at least one photodetector configured to generate the respective at least one intensity signal and comprising a respective at least one second linear polarizer that is configured to analyze the linear polarization of the optical beam, such that the respective at least one intensity signal is associated with a Faraday rotation of the reflected optical beam.

3. The system of claim 2, wherein the photodetector system further comprises a polarization-insensitive photodetector that is configured to monitor an intensity of the reflected optical beam and to provide a polarization-insensitive intensity signal, the processor being further configured to stabilize at least one adjustable parameter based on the polarization-insensitive intensity signal to distinguish the measurable parameter from a parameter change associated with the optical beam.

4. The system of claim 2, wherein the at least one photodetector comprises a plurality of photodetectors that are arranged in a pattern that substantially surrounds the laser and which are configured to generate a respective plurality of intensity signals, and wherein the optical beam is provided from the laser as a divergent beam to be reflected via the mirror as the reflected optical beam that is incident on the plurality of photodetectors.

5. The system of claim 1, wherein the control system is configured to set the wavelength of the optical beam to the on-resonance wavelength during a first time duration of a period, to a first off-resonance wavelength during a second time duration of the period, and to a second off-resonance wavelength during a third time duration of the period, the first and second off-resonance wavelengths being approximately equal and opposite with respect to the on-resonance wavelength.

6. The system of claim 1, wherein the control system is configured to set the wavelength of the optical beam to the on-resonance wavelength during a first time duration of a period, to a first off-resonance wavelength during a second time duration of the period, and to a second off-resonance wavelength during a third time duration of the period, the first and second off-resonance wavelengths being opposite and unequal with respect to at least one of time duration and frequency difference from the on-resonance wavelength.

7. The system of claim 1, wherein the mirror is a partially-silvered mirror configured to reflect a first portion of the optical beam as the reflected beam, wherein the vapor cell further comprises a photodetector configured to generate a polarization-insensitive intensity signal, the processor being further configured to stabilize at least one adjustable parameter based on the polarization-insensitive intensity signal to distinguish the measurable parameter from a parameter change associated with the optical beam.

8. A nuclear magnetic resonance (NMR) gyroscope comprising the atomic sensor system of claim 1, the NMR gyroscope being configured to calculate the measurable parameter as a rotation of the NMR gyroscope about a sensitive axis.

9. An atomic magnetometer configured comprising the atomic sensor system of claim 1, the atomic magnetometer being configured to calculate the measurable parameter as an amplitude of an external magnetic field with respect to a sensitive axis.

10. A method for controlling an atomic sensor system, the method comprising:
generating an optical beam via a laser;
providing the optical beam into a proximal end of a vapor cell that is sealed to enclose an alkali metal, the vapor cell comprising a mirror at a distal end to reflect the optical beam back as a reflected optical beam;
modulating a wavelength of the optical beam between an on-resonance wavelength with respect to the alkali metal to facilitate spin-polarization of the alkali metal and an off-resonance wavelength with respect to the alkali metal to provide a Faraday rotation of the reflected optical beam;
monitoring an intensity of the reflected optical beam at a plurality of photodetectors;
calculating a measurable parameter based on the intensity of the reflected optical beam; and
stabilizing at least one adjustable parameter based on the intensity of the reflected optical beam to distinguish the at least one measurable parameter from a parameter change associated with the optical beam.

11. The method of claim 10, wherein stabilizing the at least one adjustable parameter comprises:
stabilizing a temperature of the vapor cell in response to the intensity of the reflected optical beam based on the on-resonance wavelength of the optical beam; and
stabilize a frequency of the optical beam in response to the intensity of the reflected optical beam based on the off-resonance wavelength of the optical beam.

12. The method of claim 10, further comprising:
circularly-polarizing the optical beam before it is provided into the proximal end of the vapor cell; and
linearly-polarizing the optical beam before it is reflected via the mirror as the reflected optical beam, wherein monitoring the intensity of the reflected optical beam comprises analyzing the linear-polarization of the reflected optical beam via a linear polarizer and a first photodetector of the plurality of photodetectors to determine a Faraday rotation of the reflected optical beam, wherein calculating the measurable parameter comprises calculating the measurable parameter based on the Faraday rotation of the reflected optical beam.

13. The method of claim 12, wherein analyzing the linear-polarization comprises analyzing the linear-polarization of a first portion of the reflected optical beam, the first portion being a proper subset of the reflected optical beam, monitoring the intensity of the reflected optical beam further comprises monitoring the intensity of a second portion of the reflected optical beam at a second photodetector of the plurality of photodetectors that is polarization-insensitive, wherein stabilizing the at least one adjustable parameter comprises stabilizing the at least one adjustable parameter based on the intensity of the second portion of the reflected optical beam.

14. An atomic sensor system comprising:
a vapor cell that is sealed to enclose an alkali metal and comprising a linear polarizer and a mirror at a distal end;
an optical system comprising:
a laser configured to generate an optical beam;
a quarter-wave plate configured to circularly polarize the optical beam before it is provided into a proximal end of the vapor cell to spin-polarize the alkali metal, the optical beam being linearly-polarized via the linear polarizer and reflected via the mirror as a reflected optical beam;
a plurality of polarization-analyzing photodetectors configured to generate a respective plurality of first intensity signals corresponding to a Faraday rotation of a first portion of the reflected optical beam; and a polarization-insensitive photodetector configured to generate a second intensity signal corresponding to the intensity of a second portion of the reflected optical beam; and a processor configured to calculate a measurable parameter associated with the atomic sensor system based on the plurality of first intensity signals and to stabilize at least one adjustable parameter associated with the atomic sensor system based on the second intensity signal.

15. The system of claim 14, wherein the optical system further comprises a control system configured to modulate a wavelength of the optical beam between an on-resonance wavelength and an off-resonance wavelength with respect to the alkali metal.

16. The system of claim 15, wherein the processor is configured to stabilize a temperature of the vapor cell in response to the second intensity signal based on the on-resonance wavelength of the optical beam, and to stabilize a frequency of the optical beam in response to the second intensity signal based on the off-resonance wavelength of the optical beam.

17. The system of claim 15, wherein the control system is configured to set the wavelength of the optical beam to the on-resonance wavelength during a first time duration of a period, to a first off-resonance wavelength during a second time duration of the period, and to a second off-resonance wavelength during a third time duration of the period, the first and second off-resonance wavelengths being approximately equal and opposite with respect to the on-resonance wavelength, wherein the processor is configured to calculate the measurable parameter based on at least one of a sum and a difference of the plurality of first intensity signals during the second and third time durations.

18. The system of claim 15, wherein the mirror is a partially-silvered mirror configured to reflect the first portion of the optical beam as the reflected beam, wherein the polarization-insensitive photodetector is arranged on a distal side of the mirror.

* * * * *